(12) United States Patent
Takeuchi et al.

(10) Patent No.: US 10,434,750 B2
(45) Date of Patent: Oct. 8, 2019

(54) RESIN FILM FOR FLEXIBLE PRINTED CIRCUIT BOARD, METAL FOIL PROVIDED WITH RESIN, COVERLAY FILM, BONDING SHEET, AND FLEXIBLE PRINTED CIRCUIT BOARD

(71) Applicant: Hitachi Chemical Company, LTD., Tokyo (JP)

(72) Inventors: Masaki Takeuchi, Tokyo (JP); Yoshitsugu Matsuura, Tokyo (JP); Yuta Nakano, Tokyo (JP); Kazuhito Obata, Tokyo (JP); Katsuhiko Yasu, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 15/542,990

(22) PCT Filed: Jan. 13, 2016

(86) PCT No.: PCT/JP2016/050789
§ 371 (c)(1),
(2) Date: Jul. 12, 2017

(87) PCT Pub. No.: WO2016/114287
PCT Pub. Date: Jul. 21, 2016

(65) Prior Publication Data
US 2018/0009195 A1    Jan. 11, 2018

(30) Foreign Application Priority Data

Jan. 13, 2015 (JP) .................................. 2015-003773

(51) Int. Cl.
*B32B 15/088* (2006.01)
*B32B 27/26* (2006.01)
(Continued)

(52) U.S. Cl.
CPC ............ *B32B 15/088* (2013.01); *B32B 15/08* (2013.01); *B32B 27/26* (2013.01); *B32B 27/34* (2013.01);
(Continued)

(58) Field of Classification Search
CPC ....... B32B 15/088; B32B 15/08; B32B 27/26; B32B 27/34; B32B 2457/08; C08G 73/14;
(Continued)

(56) References Cited

U.S. PATENT DOCUMENTS 4,229,550 A * 10/1980 Jones .................... C08F 279/02
525/282
5,473,118 A * 12/1995 Fukutake ............... H05K 3/281
174/250
(Continued)

FOREIGN PATENT DOCUMENTS

JP    H08-276547 A    10/1996
JP    2005-141084 A    6/2005
(Continued)

OTHER PUBLICATIONS

Written Opinion of the International Searching Authority in International App. No. PCT/JP2016/050789, together with English language translation thereof.
(Continued)

*Primary Examiner* — Timothy J Thompson
*Assistant Examiner* — Guillermo J Egoavil
(74) *Attorney, Agent, or Firm* — Fitch, Even, Tabin & Flannery, L.L.P.

(57) ABSTRACT

The present invention relates to a resin film for a flexible printed circuit board consisting of a resin composition containing: a long-chain alkyl bismaleimide resin having a main chain containing an alkylene chain having 10 or more
(Continued)

carbon atoms and a side chain containing an alkyl group bonded to the alkylene chain; and a curing agent having two or more functional groups reacting with the long-chain alkyl bismaleimide resin.

17 Claims, 6 Drawing Sheets

(51) Int. Cl.
| | |
|---|---|
| C08L 35/00 | (2006.01) |
| G03F 7/004 | (2006.01) |
| H05K 1/02 | (2006.01) |
| H05K 3/06 | (2006.01) |
| H05K 3/18 | (2006.01) |
| B32B 15/08 | (2006.01) |
| B32B 27/34 | (2006.01) |
| C08K 5/00 | (2006.01) |
| C09D 179/08 | (2006.01) |
| C08G 73/12 | (2006.01) |
| C08L 79/08 | (2006.01) |
| H05K 3/38 | (2006.01) |

(52) U.S. Cl.
CPC ............... *C08G 73/128* (2013.01); *C08K 5/00* (2013.01); *C08L 35/00* (2013.01); *C08L 79/085* (2013.01); *C09D 179/085* (2013.01); *H05K 1/028* (2013.01); *H05K 3/386* (2013.01); *C08L 2203/16* (2013.01); *C08L 2203/20* (2013.01); *C08L 2205/025* (2013.01); *C08L 2205/05* (2013.01); *H05K 2201/0154* (2013.01); *H05K 2201/0195* (2013.01)

(58) Field of Classification Search
CPC ................ C08G 73/105; C08G 73/128; C08G 73/1042; C08K 5/00; C08L 35/00; C08L 79/08; C08L 79/085; C08L 2203/16; C08L 2203/20; C08L 2205/025; C08L 2205/05; C09D 179/085; G03F 7/004; H05K 1/028; H05K 1/0393; H05K 3/06; H05K 3/18; H05K 3/022; H05K 3/386; H05K 3/4655; H05K 3/4691; H05K 2201/0154; H05K 2201/0195; H05K 1/02; Y10T 428/264; Y10T 428/265; Y10T 428/31511; Y10T 428/31681

USPC ........ 174/250, 254; 427/96.1; 428/335, 336, 428/413, 458
See application file for complete search history.

(56) References Cited

U.S. PATENT DOCUMENTS

| | | | |
|---|---|---|---|
| 9,596,754 B2* | 3/2017 | Iwayama | H01L 21/563 |
| 2009/0258235 A1* | 10/2009 | Tateishi | C08J 7/045 |
| | | | 428/413 |
| 2010/0210745 A1* | 8/2010 | McDaniel | C09D 5/008 |
| | | | 521/55 |
| 2014/0034371 A1* | 2/2014 | Endo | G03F 7/2016 |
| | | | 174/258 |
| 2014/0326487 A1 | 11/2014 | Ozeki et al. | |
| 2015/0016072 A1* | 1/2015 | Iwayama | H01L 21/563 |
| | | | 361/748 |
| 2015/0376324 A1* | 12/2015 | Bang | C08J 9/30 |
| | | | 521/121 |

FOREIGN PATENT DOCUMENTS

| | | | | |
|---|---|---|---|---|
| JP | 2005141084 A | * | 6/2005 | |
| JP | 2006-022309 A | | 1/2006 | |
| JP | 2008-037982 A | | 2/2008 | |
| JP | 2012-116954 A | | 6/2012 | |
| JP | 2012201816 A | * | 10/2012 | ............ C08F 222/40 |
| JP | 2012-216685 A | | 11/2012 | |
| JP | 2013-083958 A | | 5/2013 | |
| JP | 2013-211348 A | | 10/2013 | |
| JP | 2014-001289 A | | 1/2014 | |
| JP | 2015-193725 A | | 11/2015 | |
| TW | 201402751 A | | 1/2014 | |
| WO | 2013/077397 A1 | | 4/2015 | |
| WO | WO 2015048575 A1 | * | 4/2015 | ......... C09D 179/085 |
| WO | WO-2015048575 A1 | * | 4/2015 | ......... C09D 179/085 |
| WO | 2014/181456 A1 | | 2/2017 | |

OTHER PUBLICATIONS

Office Action of JP Patent Application No. P2016-569471 dated Sep. 12, 2017.
International Search Report for PCT/JP2016/050789 dated Apr. 5, 2016; English translation submitted herewith (5 pages).
International Preliminary Report on Patentability dated Jul. 27, 2017, in International App. No. PCT/JP2016/050789, dated.

* cited by examiner

RESIN FILM FOR FLEXIBLE PRINTED CIRCUIT BOARD, METAL FOIL PROVIDED WITH RESIN, COVERLAY FILM, BONDING SHEET, AND FLEXIBLE PRINTED CIRCUIT BOARD

CROSS-REFERENCE TO RELATED APPLICATIONS

This application is a U.S. national phase application filed under 35 U.S.C. § 371 of International Application PCT/JP2016/050789, filed on Jan. 13, 2016, designating the United States, which claims benefit of the filing dates of JP 2015-003773, filed Jan. 13, 2015 of which is hereby incorporated herein by reference in its entirety.

TECHNICAL FIELD

The present invention relates to a resin film for a flexible printed circuit board, a metal foil provided with a resin, a coverlay film, a bonding sheet, and a flexible printed circuit board.

BACKGROUND ART

A demand for low dielectric properties (low specific dielectric constant, low dielectric dissipation factor) in a high frequency region has recently increased for a flexible printed circuit board material in association with an increase in a speed and an increase in a frequency of a transmission signal in a flexible printed circuit board. Conventionally, a polyimide film and a polyethylene terephthalate film and the like are used as a substrate film in the flexible printed circuit board. For example, substrate films having low dielectric properties such as a Teflon (registered trademark)-based material (see Patent Literature 1), a liquid crystal polymer-based material (see Patent Literature 2), and a cycloolefin-based material (see Patent Literature 3) have been proposed.

CITATION LIST

Patent Literature

Patent Literature 1: JP 08-276547 A1
Patent Literature 2: JP 2008-37982 A1
Patent Literature 3: JP 2012-216685 A1

SUMMARY OF INVENTION

Technical Problem

All of conventional materials having low dielectric properties have excellent dielectric properties, but thermally melt a molecule having a structure having few polar groups, and for example, it is difficult to use the materials as a bonding material for a substrate in order to bond substrates by press lamination or to bury a copper pattern on a substrate for circuit protection. Since the conventional materials having low dielectric properties have low polarity, the conventional materials provide a low adhesion force when a conventional epoxy adhesive or an acrylic adhesive is used even if the conventional materials are used as a core substrate, which makes it difficult to produce a member for a flexible printed circuit board such as a coverlay film or a laminated plate.

The present invention has been made in light of the above circumstances, and it is an object of the present invention to provide a resin film for a flexible printed circuit board, a metal foil provided with a resin, a coverlay film, a bonding sheet, and a flexible printed circuit board which achieve both low dielectric properties and adhesiveness to an adherend.

Solution to Problem

That is, the present invention includes the following aspects:

[1] A resin film for a flexible printed circuit board consisting of a resin composition comprising: a long-chain alkyl bismaleimide resin having a main chain containing an alkylene chain having 10 or more carbon atoms and a side chain containing an alkyl group bonded to the alkylene chain; and a curing agent having two or more functional groups reacting with the long-chain alkyl bismaleimide resin.

[2] The resin film for a flexible printed circuit board according to [1], wherein the resin composition further comprises a reaction initiator.

[3] The resin film for a flexible printed circuit board according to [1] or [2], wherein the long-chain alkyl bismaleimide resin contains a compound having a maleimide group, a divalent group having at least two imide bonds, and a saturated or unsaturated divalent hydrocarbon group.

[4] A metal foil provided with a resin comprising: the resin film for a flexible printed circuit board according to any one of [1] to [3]; and a metal foil.

[5] A coverlay film comprising: the resin film for a flexible printed circuit board according to any one of [1] to [3]; and a heat-resistant film.

[6] A bonding sheet comprising the resin film for a flexible printed circuit board according to any one of [1] to [3].

[7] A flexible printed circuit board comprising: an insulating substrate having a conductive pattern; and a resin layer provided on at least one surface of the insulating substrate, wherein the resin layer contains a cured product of a resin composition comprising: a long-chain alkyl bismaleimide resin having a main chain containing an alkylene chain having 10 or more carbon atoms and a side chain containing an alkyl group bonded to the alkylene chain; and a curing agent having two or more functional groups reacting with the long-chain alkyl bismaleimide resin.

[8] The flexible printed circuit board according to [7], wherein the resin composition further comprises a reaction initiator.

[9] The flexible printed circuit board according to [7] or [8], wherein the long-chain alkyl bismaleimide resin contains a compound having a maleimide group, a divalent group having at least two imide bonds, and a saturated or unsaturated divalent hydrocarbon group.

Advantageous Effects of Invention

The present invention can provide a resin film for a flexible printed circuit board, a metal foil provided with a resin, a coverlay film, a bonding sheet, and a flexible printed circuit board which achieve both low dielectric properties and adhesiveness to an adherend during thermal curing.

DESCRIPTION OF EMBODIMENTS

Figure 1:
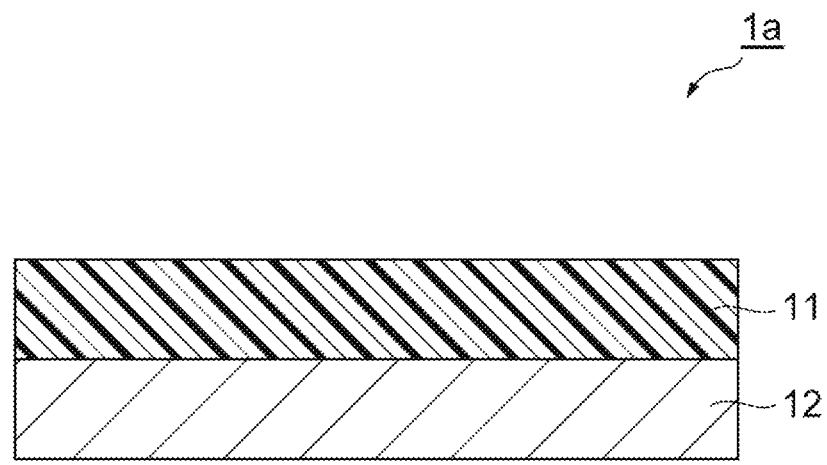
FIG. 1 is a sectional view schematically showing one embodiment of a metal foil provided with a resin.

Hereinafter, the embodiments of the present invention will be described in detail. However, the present invention is not limited to following embodiments.

In the present specification, a "resin film" refers to a film consisting of a resin composition used as a bonding material in a flexible printed circuit board, and does not include an engineering plastic film such as a polyimide film or a liquid crystal polymer film. In the present specification, a resin composition containing a solvent is also referred to as a resin composition varnish.

[Resin Film for Flexible Printed Circuit Board]

The present inventors conducted extensive studies and, as a result, found that a resin film consisting of a resin composition containing a long-chain alkyl bismaleimide resin having a side chain in an alkylene chain constituting a main chain and a curing agent having two or more functional groups reacting with the long-chain alkyl bismaleimide is suitable for the flexible printed circuit board, whereby the present invention has been accomplished. For example, the above resin film can be used, as a laminated product for a flexible printed circuit board, in combination with an insulating heat-resistant resin film such as a polyimide film or a liquid crystal polymer film.

The resin film for a flexible printed circuit board of the present embodiment consists of a resin composition containing a long-chain alkyl bismaleimide resin having a main chain containing an alkylene chain having 10 or more carbon atoms and a side chain containing an alkyl group bonded to the alkylene chain, and a curing agent having two or more functional groups reacting with the long-chain alkyl bismaleimide resin. Hereinafter, components which can be contained in the resin composition will be described.

(Long-Chain Alkyl Bismaleimide Resin)

The long-chain alkyl bismaleimide resin according to the present embodiment is a long-chain alkyl bismaleimide resin having a side chain in an alkylene chain, and has a main chain containing an alkylene chain having 10 or more carbon atoms and a side chain containing an alkyl group bonded to the alkylene chain. The long-chain alkyl bismaleimide resin has two or more thermal curing parts due to maleimide and a part expressing low dielectric properties due to the alkylene chain in one molecule, and the alkylene chain is not a straight chain and has a side chain, which provides predetermined dielectric properties in proportion to the amount of the other organic component blended. The long-chain alkyl bismaleimide resin according to the present embodiment may be referred to as a component (A). A maleimide group may be bonded to an aromatic ring or an aliphatic chain, and is preferably bonded to the aliphatic chain from the viewpoint of dielectric properties.

The main chain constituting the long-chain alkyl bismaleimide resin preferably contains an alkylene chain having 10 to 102 carbon atoms, more preferably an alkylene chain having 12 to 52 carbon atoms, and still more preferably an alkylene chain having 14 to 22 carbon atoms. The side chain preferably contains an alkyl group having 2 to 50 carbon atoms, more preferably an alkyl group having 3 to 25 carbon atoms, and still more preferably an alkyl group having 4 to 10 carbon atoms.

The content of the component (A) in the resin composition is not particularly limited. From the viewpoint that sufficient dielectric properties are likely to be obtained, the content of the component (A) may be 40% by mass or more, 45% by mass or more, or 50% by mass or more based on the total mass of the resin composition excluding the solvent. From the viewpoint that curing efficiently progresses, which is likely to provide heat resistance, the content of the component (A) may be 98% by mass or less, 97% by mass or less, or 96% by mass or less based on the total mass of the resin composition excluding the solvent. That is, the amount of the long-chain alkyl bismaleimide resin in the resin composition is preferably 40 to 98% by weight, more preferably 45 to 97% by weight, and still more preferably 50 to 96% by mass.

The molecular weight of the component (A) is not particularly limited. From the viewpoint of handling properties, the lower limit value of the weight average molecular weight (Mw) of the component (A) may be 500 or more, 1000 or more, 1500 or more, or 1700. From the viewpoint of flowability, the upper limit value of the Mw of the component (A) may be 10000 or less, 9000 or less, 7000 or less, or 5000 or less. From the viewpoint of handling properties, flowability, and circuit embeddability, the Mw of the component (A) is preferably 500 to 10000, more preferably 1000 to 9000, still more preferably 1500 to 9000, yet still more preferably 1500 to 7000, and particularly preferably 1700 to 5000.

The Mw of the component (A) can be measured by a gel permeation chromatography (GPC) method. The detail GPC condition is as follows.

Pump: L-6200 Model [manufactured by Hitachi High-Technologies Corporation]

Detector: L-3300 Model RI [manufactured by Hitachi High-Technologies Corporation]

Column oven: L-655A-52 [manufactured by Hitachi High-Technologies Corporation]

Guard column and column: TSK Guardcolumn HHR-L+ TSK gel-G4000HHR+TSK gel-G2000HHR (trade name, each of which is manufactured by Tosoh Corp.)

Column size: 6.0×40 mm (guard column), 7.8×300 mm (column)

Eluent: Tetrahydrofuran

Sample concentration: 30 mg/5 mL

Injection volume: 20 μL

Flow rate: 1.00 mL/minute

Measurement temperature: 40° C.

A method for manufacturing the component (A) is not limited. For example, the component (A) may be produced by allowing an acid anhydride to react with a diamine to synthesize an amine terminated compound, and thereafter allowing the amine terminated compound to react with excessive maleic anhydride.

Examples of the acid anhydride include pyromellitic anhydride, maleic anhydride, succinic anhydride, 3,3',4,4'-biphenyltetracarboxylic dianhydride, and 3,3',4,4'-diphenylsulfonetetracarboxylic dianhydride. These acid anhydrides may be used singly or in combination of two or more depending on objects and applications and the like. As described above, a tetravalent organic group derived from the acid anhydride described above can be used as $R_1$ of the above formula (I). From the viewpoint of better dielectric properties, the acid anhydride is preferably pyromellitic anhydride.

Examples of the diamine include a dimer diamine, 2,2-bis(4-(4-aminophenoxy)phenyl)propane, 1,3-bis(4-aminophenoxy)benzene, 4,4'-bis(4-aminophenoxy)biphenyl, 4,4'-diamino-3,3'-dihydroxybiphenyl, 4,4'-diamino-3,3'-dimethylbiphenyl, 1,3-bis[2-(4-aminophenyl)-2-propyl]benzene, 1,4-bis[2-(4-aminophenyl)-2-propyl]benzene, polyoxyalkylenediamine, and [3,4-bis(1-aminoheptyl)-6-hexyl-5-(1-octenyl)]cyclohexene. These may be used singly or in combination of two or more depending on objects, applications and the like.

The component (A) according to the present embodiment preferably contains a compound having a maleimide group (a), a divalent group having at least two imide bonds (b), and a saturated or unsaturated divalent hydrocarbon group (c) as a component (A1). The maleimide group (a) may be referred to as a structure (a); the divalent group having at least two imide bonds (b) may be referred to as a structure (b); and the saturated or unsaturated divalent hydrocarbon group (c) may be referred to as a structure (c). The use of the component (A1) makes it possible to provide a resin composition having good high-frequency characteristics and more excellent adhesiveness to an adherend.

The divalent group having at least two imide bonds (b) is not particularly limited, and examples thereof include a group represented by the following formula (I).

[Chemical Formula 1]

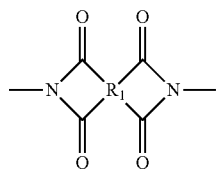

(I)

In the formula (I), $R_1$ represents a tetravalent organic group. $R_1$ is not limited as long as $R_1$ is the tetravalent organic group, and for example, from the viewpoint of handling properties, $R_1$ may be a hydrocarbon group having 1 to 100 carbon atoms, a hydrocarbon group having 2 to 50 carbon atoms, or a hydrocarbon group having 4 to 30 carbon atoms.

$R_1$ may be a substituted or unsubstituted siloxane segment. Examples of the siloxane segment include structures derived from dimethylsiloxane, methylphenylsiloxane, diphenylsiloxane and the like.

When $R_1$ is substituted, examples of substituents include an alkyl group, an alkenyl group, an alkynyl group, a hydroxyl group, an alkoxy group, a mercapto group, a cycloalkyl group, a substituted cycloalkyl group, a heterocyclic group, a substituted heterocyclic group, an aryl group, a substituted aryl group, a heteroaryl group, a substituted heteroaryl group, an aryloxy group, a substituted aryloxy group, a halogen atom, a haloalkyl group, a cyano group, a nitro group, a nitroso group, an amino group, an amide group, —C(O)H, —NR$_x$C(O)—N(R$_x$)$_2$, —OC(O)—N(R$_x$)$_2$, an acyl group, an oxyacyl group, a carboxyl group, a carbamate group, and a sulfonamide group. Herein, R$_x$ represents a hydrogen atom or an alkyl group. One or more or more of these substituents may be selected depending on objects and applications and the like.

$R_1$ is preferably, for example, a tetravalent residual group of an acid anhydride having two or more anhydride rings in one molecule, i.e., a tetravalent group formed by removing two acid anhydride groups (—C(=O)OC(=O)—) from an acid anhydride. Examples of the acid anhydride include compounds to be described later.

From the viewpoint of mechanical strength, $R_1$ is preferably aromatic, and more preferably a group formed by removing two acid anhydride groups from pyromellitic anhydride. That is, the structure (b) is more preferably a group represented by the following formula (III).

[Chemical Formula 2]

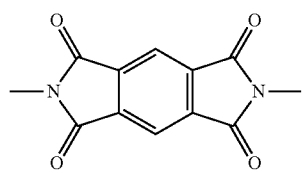

(III)

From the viewpoint of flowability and circuit embeddability, a plurality of structures (b) are preferably present in the component (A1). In that case, the divalent groups each having at least two imide bonds (b) may be the same or different from each other. The number of the structures (b) in the component (A1) is preferably 2 to 40, more preferably 2 to 20, and still more preferably 2 to 10.

From the viewpoint of dielectric properties, the structure (b) may be a group represented by the formula (IV) or the following formula (V).

[Chemical Formula 3]

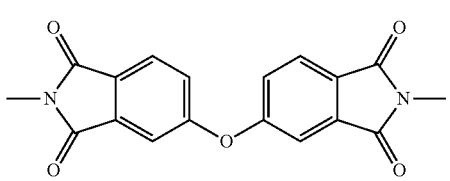

(IV)

[Chemical Formula 4]

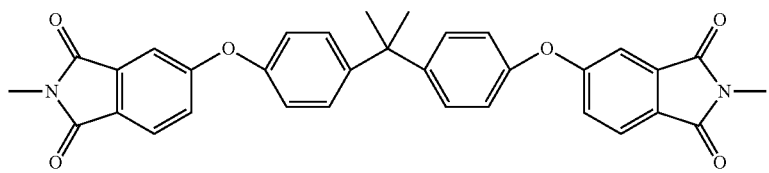

(V)

The structure (c) is not particularly limited, and may be linear, branched, or cyclic. The number of carbon atoms of the saturated or unsaturated divalent hydrocarbon group may be 8 to 100. The structure (c) is preferably an alkylene group which may have 8 to 100 carbon atoms and be branched, more preferably an alkylene group which may have 10 to 70 carbon atoms and be branched, and still more preferably an alkylene group which may have 15 to 50 carbon atoms and be branched. The component (A1) has the structure (c), which makes it possible to improve the flexibility of the resin composition according to the present embodiment to improve the handling properties (tackiness, cracks, powder falling and the like) of the resin film produced from the resin composition and to increase the strength of the resin film. The structure (c) having the above number of carbon atoms is likely to have a three-dimensional molecular structure, and increases the free volume of a polymer to enable a decrease in a density, i.e., a decrease in a dielectric constant, which is preferable.

Examples of the structure (c) include alkylene groups such as a nonylene group, a decylene group, an undecylene group, a dodecylene group, a tetradecylene group, a hexadecylene group, an octadecylene group, and a nonadecylene group; arylene groups such as a benzylene group, a phenylene group, and a naphthylene group; arylene alkylene groups such as a phenylene methylene group, a phenylene ethylene group, a benzylpropylene group, a naphthylene methylene group, and a naphthylene ethylene group; and arylene dialkylene groups such as a phenylene dimethylene group and a phenylene diethylene group.

From the viewpoint of high-frequency characteristics, low thermal expansion characteristics, adhesiveness to a conductor, heat resistance, and low moisture absorption, the structure (c) is particularly preferably a group represented by the following formula (II).

[Chemical Formula 5]

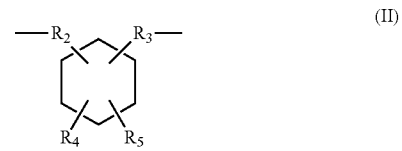

(II)

In the formula (II), $R_2$ and $R_3$ each independently represent an alkylene group having 4 to 50 carbon atoms. From the viewpoint of a further improvement in flexibility and easiness of synthesis, $R_2$ and $R_3$ each independently represent preferably an alkylene group having 5 to 25 carbon atoms, more preferably an alkylene group having 6 to 10 carbon atoms, and still more preferably an alkylene group having 7 to 10 carbon atoms.

In the formula (II), $R_4$ represents an alkyl group having 4 to 50 carbon atoms. From the viewpoint of a further improvement in flexibility and easiness of synthesis, $R_4$ is preferably an alkyl group having 5 to 25 carbon atoms, more preferably an alkyl group having 6 to 10 carbon atoms, and still more preferably an alkyl group having 7 to 10 carbon atoms.

In the formula (II), $R_5$ represents an alkyl group having 2 to 50 carbon atoms. From the viewpoint of a further improvement in flexibility and easiness of synthesis, $R_5$ is preferably an alkyl group having 3 to 25 carbon atoms, more preferably an alkyl group having 4 to 10 carbon atoms, and still more preferably an alkyl group having 5 to 8.

From the viewpoint of flowability and circuit embeddability, a plurality of structures (c) are preferably present in the component (A1). In that case, the structures (c) may be the same or different from each other. For example, 2 to 40 structures (c) are preferably present in the component (A1); 2 to 20 structures (c) are preferably present; and 2 to 10 structures (c) are more preferably present in one molecule.

For example, the following compounds may be contained as the component (A).

[Chemical Formula 6]

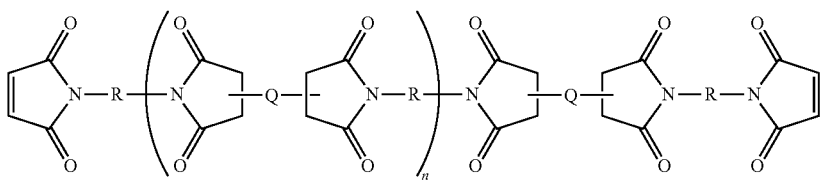

In the formula, R and Q each independently represent a divalent organic group. The same as the above-mentioned structure (c) can be used as R, and the same as the above-mentioned $R_1$ can be used as Q. n represents an integer of 1 to 10.

Commercially available compounds can also be used as the component (A). Examples of the commercially available compounds include a product manufactured by Designer Molecules Inc., and specific examples thereof include BMI-1500, BMI-1700, BMI-3000, BMI-5000, and BMI-9000 (each of which is trade name). From the viewpoint of obtaining better high-frequency characteristics, it is more preferable to use BMI-3000 as the component (A).

(Curing Agent)

The curing agent according to the present embodiment has two or more functional groups reacting with the long-chain alkyl bismaleimide resin which is the component (A). The curing agent may be referred to as a component (B).

Examples of the curing agent include alicyclic maleimides, aromatic maleimides, unsaturated hydrocarbons, aromatic amines, aliphatic amines, alicyclic amines, acid anhydrides, and isocyanates. By adding the component (B), the number of crosslinking points increases, and heat resistance and the like improve.

The content of the curing agent is not particularly limited, and from the viewpoint of heat resistance, the lower limit value of the content of the curing agent may be 2% by mass or more, 3% by mass or more, or 4% by mass or more based on the total mass of the resin composition. From the viewpoint of dielectric properties, the upper limit value of the content of the curing agent may be 60% by mass or less, 55% by mass or less, or 50% by mass or less based on the total mass of the resin composition. From the viewpoint of heat resistance and dielectric properties, the content of the curing agent is preferably 2 to 60% by mass, more preferably 3 to 55% by mass, and still more preferably 4 to 50% by mass based on the total mass of the resin composition.

The curing agent preferably contains a different maleimide group-containing compound from the component (A). Compounds which may correspond to both the component (A) and the maleimide group-containing compound shall attribute to the component (A). By using the component (A) and the maleimide group-containing compound in combination, high adhesiveness to a conductor, heat resistance, low thermal expansion characteristics, flame retardancy, processability (drilling and cutting) and the like can be further improved while good dielectric properties are maintained.

The maleimide group-containing compound is not particularly limited, and from the viewpoint of high-frequency characteristics and the like, the maleimide group-containing compound preferably has an aromatic ring, and is also preferably a polymaleimide compound containing two or more maleimide groups. The maleimide group may be bonded to an aromatic ring or an aliphatic chain, and is preferably bonded to the aromatic ring from the viewpoint of dielectric properties. Specific examples of the maleimide group-containing compound include 1,2-dimaleimidoethane, 1,3-dimaleimidopropane, bis(4-maleimidephenyl)methane, bis(3-ethyl-4-maleimidephenyl)methane, bis(3-ethyl-5-methyl-4-maleimidephenyl)methane, 2,7-dimaleimidofluorene, N,N'-(1,3-phenylene)bismaleimide, N,N'-(1,3-(4-methylphenylene))bismaleimide, bis(4-maleimidephenyl)sulfone, bis(4-maleimidephenyl)sulfide, bis(4-maleimidephenyl) ether, 1,3-bis(3-maleimidephenoxy)benzene, 1,3-bis(3-(3-maleimidephenoxy)phenoxy)benzene, bis(4-maleimidephenyl)ketone, 2,2-bis(4-(4-maleimidephenoxy)phenyl)propane, bis(4-(4-maleimidephenoxy)phenyl)sulfone, bis[4-(4-maleimidephenoxy)phenyl]sulfoxide, 4,4'-bis(3-maleimidephenoxy)biphenyl, 1,3-bis(2-(3-maleimidephenyl)propyl)benzene, 1,3-bis(1-(4-(3-maleimidephenoxy)phenyl)-1-propyl)benzene, bis(maleimidecyclohexyl)methane, 2,2-bis[4-(3-maleimidephenoxy)phenyl]-1,1,1,3,3,3-hexafluoropropane, and bis(maleimidephenyl)thiophene. These may be used singly or in combination of two or more. Among these, from the viewpoint of further decreasing moisture absorption and a thermal expansion coefficient, it is preferable to use bis(3-ethyl-5-methyl-4-maleimidephenyl)methane. From the viewpoint of further increasing the breaking strength of the resin film formed from the resin composition and metal foil peel-off strength, it is preferable to use 2,2-bis(4-(4-maleimidephenoxy)phenyl)propane as the curing agent.

Examples of the maleimide group-containing compound (B) include a compound represented by the following formula (VI).

[Chemical Formula 7]

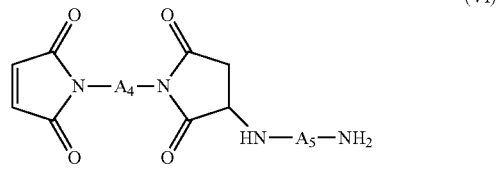

(VI)

In the formula (VI), $A_4$ represents a residual group represented by the following formula (VII), (VIII), (IX) or (X), and $A_5$ represents a residual group represented by the following formula (XI).

[Chemical Formula 8]

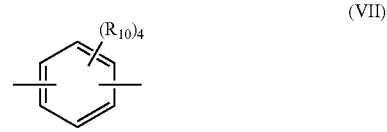

(VII)

In the formula (VII), $R_{10}$ each independently represent a hydrogen atom, an aliphatic hydrocarbon group having 1 to 5 carbon atoms, or a halogen atom.

[Chemical Formula 9]

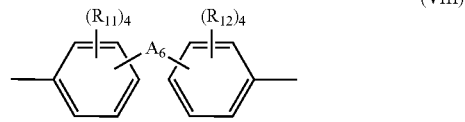

(VIII)

In the formula (VIII), $R_{11}$ and $R_{12}$ each independently represent a hydrogen atom, an aliphatic hydrocarbon group having 1 to 5 carbon atoms, or a halogen atom, and $A_6$ represents an alkylene group or alkylidene group having 1 to 5 carbon atoms, an ether group, a sulfide group, a sulfonyl group, a ketone group, a single bond, or a residual group represented by the following formula (VIII-1).

[Chemical Formula 10]

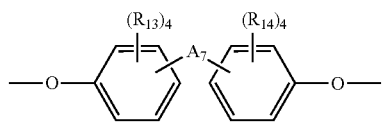
(VIII-1)

In the formula (VIII-1), $R_{13}$ and $R_{14}$ each independently represent a hydrogen atom, an aliphatic hydrocarbon group having 1 to 5 carbon atoms, or a halogen atom, and $A_7$ represents an alkylene group having 1 to 5 carbon atoms, an isopropylidene group, an ether group, a sulfide group, a sulfonyl group, a ketone group, or a single bond.

[Chemical Formula 11]

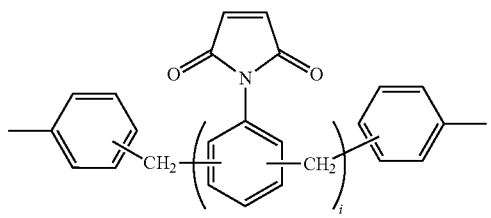
(IX)

In the formula (IX), i is an integer of 1 to 10.

[Chemical Formula 12]

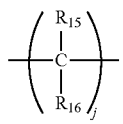
(X)

In the formula (X), $R_{15}$ and $R_{16}$ each independently represent a hydrogen atom or an aliphatic hydrocarbon group having 1 to 5 carbon atoms, and j is an integer of 1 to 8.

[Chemical Formula 13]

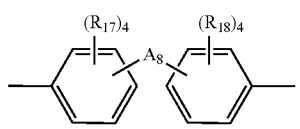
(XI)

In the formula (XI), $R_{17}$ and $R_{18}$ each independently represent a hydrogen atom, an aliphatic hydrocarbon group having 1 to 5 carbon atoms, an alkoxy group having 1 to 5 carbon atoms, a hydroxyl group, or a halogen atom, and $A_8$ represents an alkylene group or alkylidene group having 1 to 5 carbon atoms, an ether group, a sulfide group, a sulfonyl group, a ketone group, a fluorenylene group, a single bond, a residual group represented by the following formula (XI-1), or a residual group represented by the following formula (XI-2).

[Chemical Formula 14]

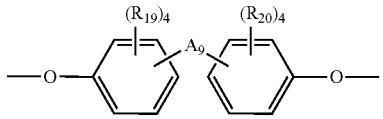
(XI-1)

In the formula (XI-1), $R_{19}$ and $R_{20}$ each independently represent a hydrogen atom, an aliphatic hydrocarbon group having 1 to 5 carbon atoms, or a halogen atom, and $A_9$ represents an alkylene group having 1 to 5 carbon atoms, an isopropylidene group, a m-phenylene diisopropylidene group, a p-phenylene diisopropylidene group, an ether group, a sulfide group, a sulfonyl group, a ketone group, or a single bond.

[Chemical Formula 15]

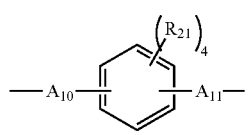
(XI-2)

In the formula (XI-2), $R_{21}$ each independently represent a hydrogen atom, an aliphatic hydrocarbon group having 1 to 5 carbon atoms, or a halogen atom, and $A_{10}$ and $A_{11}$ each independently represent an alkylene group having 1 to 5 carbon atoms, an isopropylidene group, an ether group, a sulfide group, a sulfonyl group, a ketone group, or a single bond.

From the viewpoint of solubility in an organic solvent, high-frequency characteristics, high adhesiveness to a conductor, formability of a prepreg, and the like, the maleimide group-containing compound is preferably used as a polyamino bismaleimide compound. The polyamino bismaleimide compound is obtained by, for example, subjecting a compound having two maleimide groups at terminals, and an aromatic diamine compound having two primary amino groups in a molecule to Michael addition reaction in an organic solvent.

The aromatic diamine compound having two primary amino groups in a molecule is not particularly limited, and examples thereof include 4,4'-diamino diphenyl ether, 4,4'-diamino diphenyl methane, 4,4'-diamino-3,3'-dimethyl-diphenyl methane, 2,2'-dimethyl-4,4'-diamino biphenyl, 2,2-bis(4-(4-aminophenoxy)phenyl)propane, 4,4'-[1,3-phenylenebis(1-methylethylidene)]bisaniline, and 4,4'-[1,4-phenylenebis(1-methylethylidene)]bisaniline. These may be used singly or in combination of two or more.

From the viewpoint of allowing solubility in an organic solvent, a reaction rate during synthesizing, and heat resistance to be improved, 4,4'-diamino diphenyl ether, 4,4'-diamino diphenyl methane, and 4,4'-diamino-3,3'-dimethyl-diphenyl methane are preferable. These may be used singly or in combination of two or more depending on objects, applications and the like.

The organic solvent used in manufacturing the polyamino bismaleimide compound is not particularly limited, and examples thereof include alcohols such as methanol, ethanol, butanol, butylcellosolve, ethylene glycol monomethyl ether, and propylene glycol monomethyl ether; ketones such as acetone, methyl ethyl ketone, methyl isobutyl ketone, and cyclohexanone; aromatic hydrocarbons such as toluene, xylene, and mesitylene; esters such as methoxyethyl acetate, ethoxyethyl acetate, butoxyethyl acetate, and ethyl acetate; and nitrogen-containing solvents such as N,N-dimethylformamide, N,N-dimethylacetamide, and N-methyl-2-pyrrolidone. These may be used singly or in combination of two or more. Among these, from the viewpoint of solubility, methyl ethyl ketone, cyclohexanone, propylene glycol monomethyl ether, N,N-dimethylformamide, and N,N-dimethylacetamide are preferable.

(Reaction Initiator)

The resin composition according to the present embodiment may contain a reaction initiator in order to be likely to facilitate the thermal curing of the component (A). The reaction initiator is not particularly limited, and examples thereof include a peroxide. The content of the reaction initiator is not particularly limited, and may be 0.1 to 5% by mass based on the total mass of the resin composition.

Examples of the peroxide include dicumyl peroxide, dibenzoyl peroxide, 2-butanone peroxide, tert-butyl perbenzoate, di-tert-butyl peroxide, 2,5-dimethyl-2,5-di(t-butylperoxy)hexane, bis(tert-butyl peroxyisopropyl)benzene, and tert-butyl hydroperoxide.

(Inorganic Filler)

The resin composition according to the present embodiment may further contain an inorganic filler. By virtue of optionally containing an appropriate inorganic filler, it is possible to improve the low thermal expansion characteristics, high modulus property, heat resistance, flame retardancy and the like of the resin film. The inorganic filler is not particularly limited, and examples thereof include silica, alumina, titanium oxide, mica, beryllia, barium titanate, potassium titanate, strontium titanate, calcium titanate, aluminum carbonate, magnesium hydroxide, aluminum hydroxide, aluminum silicate, calcium carbonate, calcium silicate, magnesium silicate, silicon nitride, boron nitride, calcined clay, talc, aluminum borate, and silicon carbide. These may be used singly or in combination of two or more.

The shape and particle diameter of the inorganic filler are not also particularly limited. The particle diameter of the inorganic filler may be, for example, 0.01 to 20 μm or 0.1 to 10 μm. The term "particle diameter" used herein indicates an average particle diameter, which corresponds to a particle diameter determined at a point of 50% volume in a cumulative frequency distribution curve obtained from the particle diameters when the whole volume of the particles is taken as 100%. The average particle diameter can be measured by means of a particle size distribution measurement apparatus using a laser diffraction scattering method, and the like.

When the inorganic filler is used, the amount of the inorganic filler used is not particularly limited, and for example, the content ratio of the inorganic filler is preferably 3 to 75% by volume, and more preferably 5 to 70% by volume when a solid content in the resin composition is taken as the whole amount. When the content ratio of the inorganic filler in the resin composition is in the above range, good curing properties, formability, and chemical resistance are likely to be obtained.

When the inorganic filler is used, for the purpose of improving the dispersibility of the inorganic filler and the adhesiveness of the inorganic filler to the organic components, if necessary, a coupling agent can be used in combination. The coupling agent is not particularly limited, and, for example, various types of silane coupling agents, titanate coupling agents and the like can be used. These may be used singly or in combination of two or more. The amount of the coupling agent used is not also particularly limited, and, for example, based on 100 parts by mass of the inorganic filler used, the amount of the coupling agent may be 0.1 to 5 parts by mass or 0.5 to 3 parts by mass. When the amount of the coupling agent is in the above range, various characteristics are less likely to become poor, and the characteristic features obtained by the use of the inorganic filler is likely to be effectively exhibited.

When a coupling agent is used, a so-called integral blend treatment method in which an inorganic filler is blended into a resin composition and then a coupling agent is added thereto may be used, but a method for using an inorganic filler having a surface preliminarily treated with a coupling agent by a dry process or a wet process is preferable. By using such a method, the characteristic features of the inorganic filler can be more effectively exhibited.

(Thermosetting Resin)

The resin composition of the present embodiment may further contain a thermosetting resin (C) different from the component (A) and the component (B). Compounds which may correspond to the component (A) or the component (B) shall not attribute to the thermosetting resin (C). Examples of the thermosetting resin (C) include an epoxy resin and a cyanate ester resin. By virtue of containing the thermosetting resin (C), it is possible to further improve the low thermal expansion characteristics of the resin film, and the like.

When an epoxy resin is contained as the thermosetting resin (C), the epoxy resin is not particularly limited, and examples thereof include bisphenol A epoxy resins, bisphenol F epoxy resins, bisphenol S epoxy resins, alicyclic epoxy resins, aliphatic linear epoxy resins, phenolic novolak epoxy resins, cresol novolak epoxy resins, bisphenol A novolak epoxy resins, phenolic aralkyl epoxy resins, naphthalene skeleton-containing epoxy resins such as naphthol novolak epoxy resins and naphthol aralkyl epoxy resins, difunctional biphenyl epoxy resins, biphenylaralkyl epoxy resins, dicyclopentadiene epoxy resins, and dihydroanthracene epoxy resins. These may be used singly or in combination of two or more. Among these, from the viewpoint of high-frequency characteristics and thermal expansion characteristics, naphthalene skeleton-containing epoxy resins or biphenylaralkyl epoxy resins are preferably used.

When a cyanate ester resin is contained as the thermosetting resin (C), the cyanate ester resin is not particularly limited, and examples thereof include 2,2-bis(4-cyanatophenyl)propane, bis(4-cyanatophenyl)ethane, bis(3,5-dimethyl-4-cyanatophenyl)methane, 2,2-bis(4-cyanatophenyl)-1,1,1,3,3,3-hexafluoropropane, α,α'-bis(4-cyanatophenyl)-m-diisopropylbenzene, cyanate ester compounds of a phenol-added dicyclopentadiene polymer, phenolic novolak cyanate ester compounds, and cresol novolak cyanate ester compounds. These may be used singly or in combination of two or more. Among these, from the viewpoint of inexpensiveness and the total balance between high-frequency characteristics and the other characteristics, 2,2-bis(4-cyanatophenyl)propane is preferably used.

The resin composition according to the present embodiment may further contain a curing agent or curing accelerator for the thermosetting resin (C). This makes it possible to smoothly facilitate a reaction for obtaining a cured product of the resin composition, and to moderately adjust the physical properties of the obtained cured product of the resin composition. The component (B) shall not attribute to the curing agent for the thermosetting resin (C).

When an epoxy resin is used, a curing agent for the epoxy resin is not particularly limited, and examples thereof include polyamine compounds such as diethylenetriamine, triethylenetetramine, diaminodiphenylmethane, m-phenylenediamine, and dicyandiamide; polyphenol compounds such as bisphenol A, phenolic novolak resins, cresol novolak resins, bisphenol A novolak resins, and phenolic aralkyl resins; acid anhydrides such as phthalic anhydride and pyromellitic anhydride; various carboxylic acid compounds; and various active ester compounds.

When a cyanate ester resin is used, a curing agent for the cyanate ester resin is not particularly limited, and examples thereof include various monophenol compounds, various polyphenol compounds, various amine compounds, various alcohol compounds, various acid anhydrides, and various carboxylic acid compounds. These may be used singly or in combination of two or more.

Examples of a curing accelerator for the epoxy resin include various imidazoles, $BF_3$ amine complexes, and phosphorous curing accelerators which are latent thermosetting agents. From the viewpoint of the preservation stability of the resin composition, the handling properties of a B staged (semicured) resin composition, and solder heat resistance, the imidazoles and the phosphorous curing accelerators are preferable.

(Thermoplastic Resin)

The resin composition according to the present embodiment may further contain a thermoplastic resin. The kind of the thermoplastic resin is not particularly limited, and the molecular weight of the thermoplastic resin is not also limited, but the number average molecular weight (Mn) of the thermoplastic resin is preferably 200 to 60000 in light of further improving compatibility with the component (A).

From the viewpoint of film formability and moisture absorption resistance, the thermoplastic resin is preferably a thermoplastic elastomer. Examples of the thermoplastic elastomer include a saturated thermoplastic elastomer, and examples of the saturated thermoplastic elastomer include a chemically modified saturated thermoplastic elastomer and an unmodified saturated thermoplastic elastomer. Examples of the chemically modified saturated thermoplastic elastomer include a styrene-ethylene-butylene copolymer modified by maleic anhydride. Specific examples of the chemically modified saturated thermoplastic elastomer include Tuftecs M1911, M1913, and M1943 (trade names, each of which is manufactured by Asahi Kasei Chemicals Corporation). On the other hand, examples of the unmodified saturated thermoplastic elastomer include an unmodified styrene-ethylene-butylene copolymer. Specific examples of the unmodified saturated thermoplastic elastomer include Tuftecs H1041, H1051, H1043, and H1053 (trade names, each of which is manufactured by Asahi Kasei Chemicals Corporation).

From the viewpoint of film formability, dielectric properties, and moisture absorption resistance, the saturated thermoplastic elastomer more preferably has a styrene unit in a molecule. In the present specification, the styrene unit refers to a unit derived from a styrene monomer in a polymer, and the saturated thermoplastic elastomer refers to one having a structure in which each aliphatic hydrocarbon portion other than an aromatic hydrocarbon portion of a styrene unit is composed of a saturated bonding group.

The content ratio of the styrene unit in the saturated thermoplastic elastomer is not particularly limited, and the mass percentage of the styrene unit based on the total mass of the saturated thermoplastic elastomer is preferably 20 to 80% by mass, and more preferably 30 to 70% by mass.

When the content ratio of the styrene unit is in the above range, film appearance, heat resistance, and adhesiveness tend to be excellent.

Specific examples of the saturated thermoplastic elastomer having a styrene unit in a molecule include a styrene-ethylene-butylene copolymer. The styrene-ethylene-butylene copolymer can be obtained by hydrogenating an unsaturated double bond included in a structure unit derived from butadiene of a styrene-butadiene copolymer, for example.

The content of the thermoplastic resin is not particularly limited, and from the viewpoint of providing better dielectric properties, the content of the thermoplastic resin is preferably 5 to 60% by mass, and more preferably 10 to 50% by mass based on the total mass of the resin composition.

The resin composition according to the present embodiment can be obtained by uniformly dispersing and mixing the above components, and the preparation method, conditions and the like are not particularly limited. Examples thereof include a method for stirring and mixing predetermined blending amounts of various components uniformly enough, using a mixer and the like, thereafter kneading using a mixing roll, an extrusion machine, a kneader, a roller, an extruder or the like, and cooling and pulverizing the obtained kneaded product. The kneading method is not also particularly limited.

The specific dielectric constant of the cured product of the resin composition according to the present embodiment is not particularly limited, and from the viewpoint of suitable use in a high-frequency zone, the specific dielectric constant at 10 GHz is preferably 3.6 or less, more preferably 3.1 or less, and still more preferably 3.0 or less. The lower limit of the specific dielectric constant is not particularly limited, and may be about 1.0, for example. The dielectric dissipation factor of the cured product of the resin composition according to the present embodiment is preferably 0.004 or less, and more preferably 0.003 or less. The lower limit of the specific dielectric constant is not particularly limited, and may be about 0.0001, for example. The specific dielectric constant and the dielectric dissipation factor can be measured by methods shown in the following Examples.

Since the resin film according to the present embodiment has a lower elastic modulus than those of a polyimide film and liquid crystal polymer film, a flexible circuit board having small deformation such as distortion, and small warpage can be obtained by combining the resin film with a flexible printing circuit board manufactured using the polyimide film or the liquid crystal polymer film. From the viewpoint of suppressing warpage, the elastic modulus of the cured product of the resin composition is preferably 3 GPa or less at 25° C., more preferably 2 GPa or less, and still more preferably 1 GPa or less. The lower limit value of the elastic modulus of the cured product of the resin composition is not particularly limited, and may be 50 MPa, for example.

[Method for Manufacturing Resin Film]

The resin film according to the present embodiment is manufactured using the above resin composition. The method for manufacturing the resin film is not limited, and for example, the resin film is obtained by applying the resin composition according to the present embodiment on a support substrate, followed by drying.

Specifically, the above resin composition may be applied on a support substrate using a kiss coater, a roll coater, a comma coater and the like, and then dried at, for example, 70 to 250° C., and preferably 70 to 200° C. for 1 to 30 minutes, and preferably for 3 to 15 minutes in a heating drying furnace and the like. Thereby, it is possible to obtain a resin film in which the resin composition is semicured.

The resin film can be thermally cured by further heating the semicured resin film in a heating furnace at, for example, 170 to 250° C., and preferably 185 to 230° C. for 60 to 150 minutes.

The thickness of the resin film according to the present embodiment is not particularly limited, and preferably 1 to 200 μm, more preferably 2 to 180 μm, and still more preferably 3 to 150 μm. The thickness of the resin film is set to the above range, which not only makes it possible to achieve a decrease in the thickness of the flexible printed circuit board obtained by using the resin film according to the present embodiment, but also tends to allow an insulating layer having excellent high-frequency characteristics and high film thickness accuracy to be formed.

The support substrate is not particularly limited. The support substrate can be appropriately determined according to the applications of the resin film (a metal foil provided with a resin, a coverlay film, a bonding sheet and the like which will be described later). By appropriately selecting the support substrate in the manufacturing step of the resin film, the metal foil provided with a resin, coverlay film, and bonding sheet of the present embodiment can be manufactured.

[Metal Foil Provided with Resin]

The metal foil provided with a resin of the present embodiment includes the above-mentioned resin film for a flexible printed circuit board, and a metal foil. The schematic sectional view of the metal foil provided with a resin is shown in FIG. 1. A metal foil provided with a resin 1a has a configuration in which a resin film 11 according to the present embodiment is adhered onto one surface of a metal foil 12. As the metal foil 12, a foil made of copper, aluminum, iron, gold, silver, nickel, palladium, chromium, molybdenum or an alloy thereof is suitably used, and a copper foil is preferable from the viewpoint of processability, bending property, electrical conductivity and the like. To increase the adhesion force with the resin film 11, the surface of the metal foil may be mechanically or chemically treated by chemical roughening; plating; and a treatment using aluminum alcoholate, aluminum chelate, a silane coupling agent or the like. The metal foil provided with a resin of the present embodiment can be manufactured by selecting the metal foil as the support substrate in the above method for manufacturing a resin film, for example.

[Coverlay Film]

Figure 2:
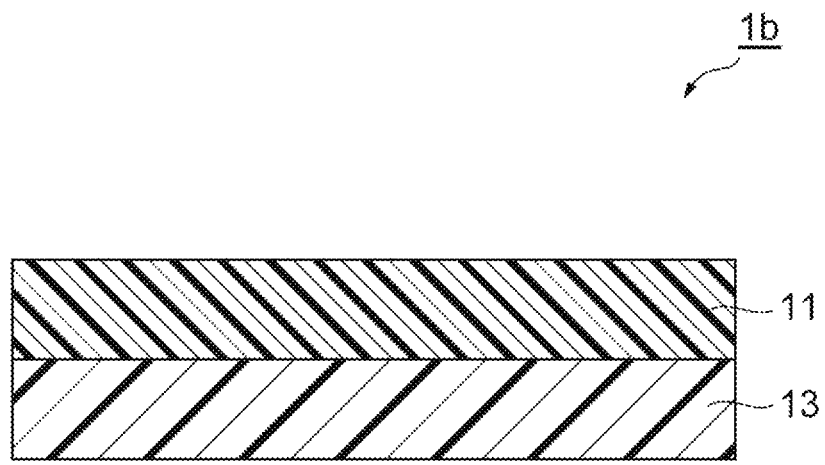
FIG. 2 is a sectional view schematically showing one embodiment of a coverlay film.

The coverlay film of the present embodiment includes the above-mentioned resin film for a flexible printed circuit board, and a heat-resistant film. The schematic sectional view of the coverlay film is shown in FIG. 2. A coverlay film 1b has a configuration in which the resin film 11 according to the present embodiment is adhered onto one surface of a commercially available heat-resistant film 13. Examples of the heat-resistant film 13 include polyimide films such as Upirex (trade name, Ube Industries, Ltd.), Kapton (trade name, Toray-DuPont Co., Ltd.), and Apical (trade name, Kaneka Corporation); liquid crystal polymer films such as VECSTAR (trade name, manufactured by Kuraray Co., Ltd.) and SUMIKASUPER LCP (trade name, manufactured by Sumitomo Chemical Co., Ltd.); and PPS films such as TORELINA (trade name, manufactured by Toray Industries, Inc.). The coverlay film of the present embodiment can be manufactured by selecting the heat-resistant film as the support substrate in the above method for manufacturing a resin film, for example.

[Bonding Sheet]

Figure 3:
FIG. 3 is a sectional view schematically showing one embodiment of a bonding sheet.

The bonding sheet of the present embodiment includes the above-mentioned resin film for a flexible printed circuit board. The schematic sectional view of the bonding sheet is shown in FIG. 3. A bonding sheet 1d includes the resin film 11 obtained by making the resin composition according to the present embodiment into a film. It is preferable to store the bonding sheet in a state where the bonding sheet abuts on the support substrate, and to peel off the support substrate when manufacturing the flexible printed circuit board. Examples of the support substrate include a polyester film such as a polyethylene terephthalate (PET) film, a polyimide film, a polyparabanic acid film, a polyether ether ketone film, a polyphenylenesulfide film, an aramid film, a polycarbonate film, and a polyarylate film. The bonding sheet of the present embodiment can be manufactured by, for example, selecting the film illustrated above as the support substrate in the above method for manufacturing a resin film.

[Flexible Printed Circuit Board]

The flexible printed circuit board of the present embodiment includes an insulating substrate having a conductive pattern, and a resin layer provided on at least one surface of the insulating substrate, and the resin layer contains a cured product of a resin composition which contains a long-chain alkyl bismaleimide resin having a main chain containing an alkylene chain having 10 or more carbon atoms and a side chain containing an alkyl group bonded to the alkylene chain, and a curing agent having two or more functional groups reacting with the long-chain alkyl bismaleimide resin.

(Insulating Substrate)

The insulating substrate according to the present embodiment is appropriately selected depending on objects. Examples of the insulating substrate include a polyimide film (PI), a polyethylenenaphthalate film (PEN), a liquid crystal polymer film (LCP), and a polyethylene terephthalate film (PET). The insulating substrate is preferably a polyimide film from the viewpoint of heat-resistant strength.

As the polyimide film, it is possible to use commercially available polyimide films such as Upirex R, Upirex S, and Upirex SGA (trade names) manufactured by Ube Industries, Ltd., Kapton H, Kapton V, Kapton E, Kapton EN, and Kapton ENZT (trade names) manufactured by Toray-DuPont Co., Ltd., and Apical AH and Apical NPI (trade names) manufactured by Kaneka Corporation. In order to improve adhesiveness to the resin layer, the surfaces of these polyimide films may be subjected to a plasma treatment, a corona discharge treatment or the like.

From the viewpoint of film handling properties and processability, the thickness of the insulating substrate is preferably 5 to 250 μm, more preferably 10 to 175 μm, and still more preferably 25 to 150 μm.

(Resin Layer)

As the resin layer, the same as the above-mentioned resin film according to the present embodiment can be used, and a preferable embodiment is also the same.

(Conductive Pattern)

Examples of the conductor layer included in the conductive pattern include copper, aluminum, iron, gold, silver, nickel, palladium, chromium, molybdenum or an alloy thereof, and copper is preferable from the viewpoint of conductive property. The conductor layer may be an alloy, and examples of a copper alloy include a highly-pure copper alloy to which beryllium or cadmium is added in a small amount.

A method for forming the conductive pattern is not particularly limited. For example, the conductive pattern can be formed by a subtractive method, a semi-additive method, a full-additive method and the like.

Figure 4:
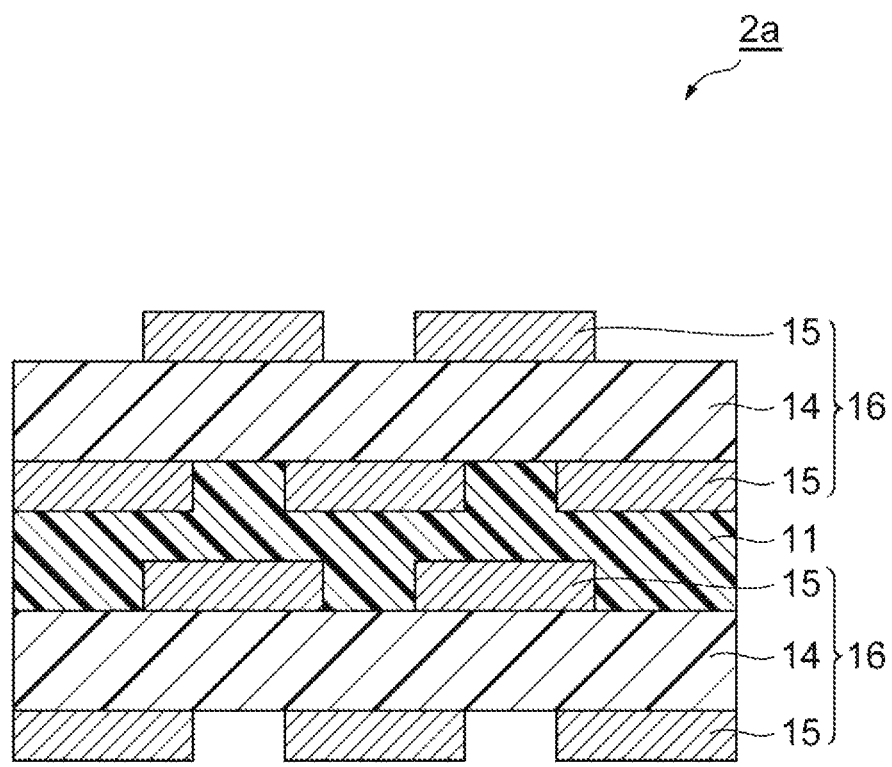
FIG. 4 is a sectional view schematically showing one embodiment of a flexible printed circuit board.

FIG. 4 is a sectional view schematically showing one embodiment of the flexible printed circuit board. A flexible printed circuit board 2a is formed by laminating two flexible double-sided printed circuit boards 16 in which conductive patterns 15 are formed on both surfaces of an insulating substrate 14, in a state where a resin layer made of the resin film 11 is sandwiched between the flexible double-sided printed circuit boards 16.

It is possible to use, for example, heat pressing, lamination and the like as the laminating method. In the heat pressing, the resin film may be thermally cured by heating the resin film in a temperature range of, for example, 100 to 300° C., and preferably 150 to 250° C. A heat pressing temperature of 100° C. or higher provides a sufficient adhesion force to facilitate pasting, and a heat pressing temperature of 300° C. or lower makes it difficult to cause the thermal decomposition of the resin composition. In the heat pressing, a pressure may be applied, for example, at 1 MPa or more, and preferably 2 MPa or more and 5 MPa or less with warming.

The lamination may be performed under reduced pressure conditions of a press-adhering temperature (lamination temperature) of 60 to 140° C., a press-adhering pressure of 0.1 to 1.1 mPa, and an air pressure of 20 mmHg (26.7 hPa) or less using a vacuum laminator and the like. The laminating method may be a batch method or a continuous method using a roll.

Figure 5:
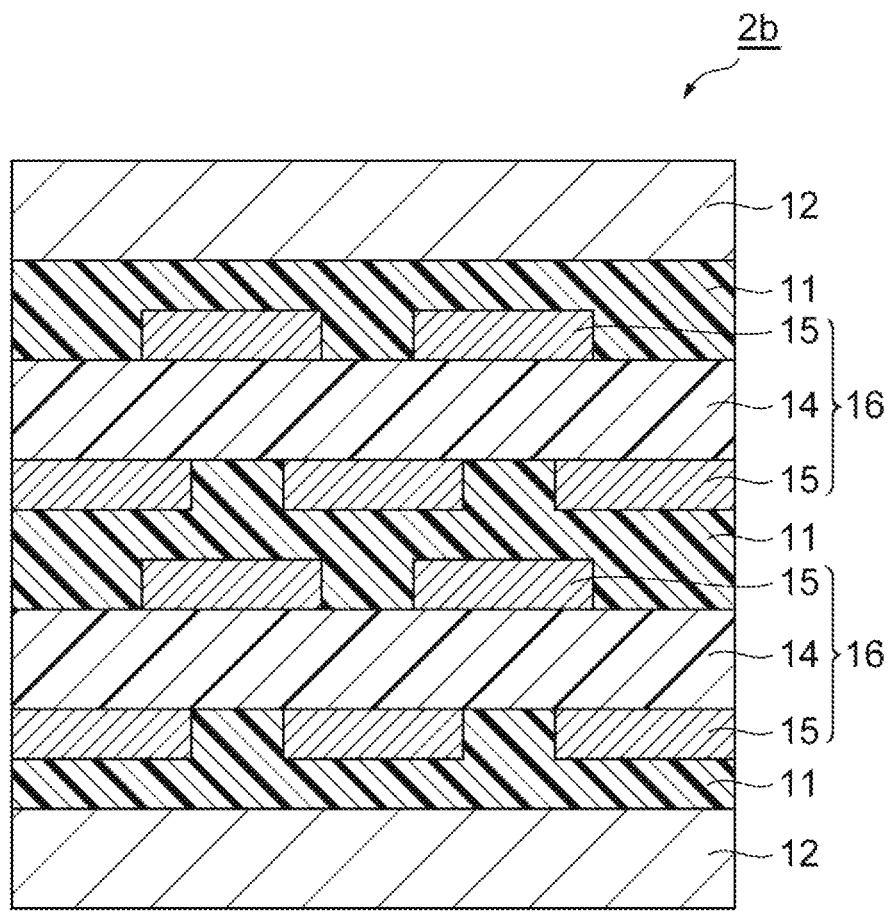
FIG. 5 is a sectional view schematically showing one embodiment of a flexible printed circuit board.

FIG. 5 is also a sectional view schematically showing one embodiment of the flexible printed circuit board. A flexible printed circuit board 2b has a configuration in which a metal foil provided with a resin 1a is adhered onto each of both surfaces of the flexible printed circuit board 2a in a state where the metal foil faces the outside. The flexible printed circuit board 2b is obtained by laminating the flexible printed circuit board 2a and the two metal foils provided with a resin 1a. The laminating method is the same as that of the above.

Figure 6:
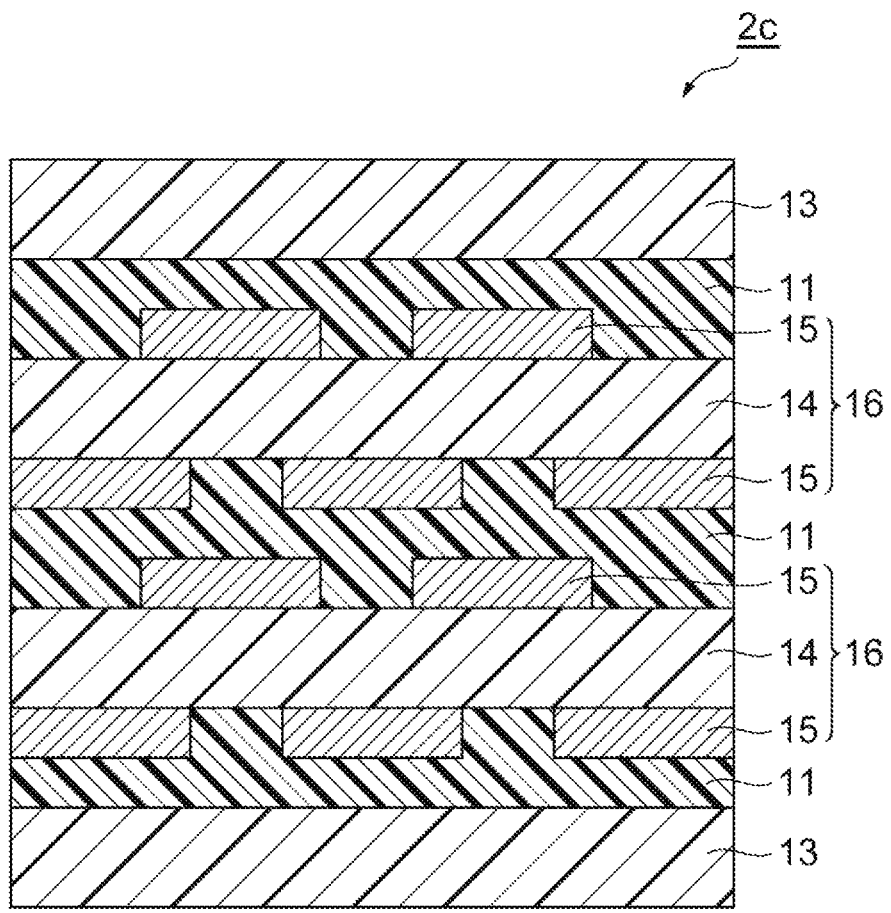
FIG. 6 is a sectional view schematically showing one embodiment of a flexible printed circuit board.

FIG. 6 is also a sectional view schematically showing one embodiment of the flexible printed circuit board. A flexible printed circuit board 2c has a configuration in which a coverlay film 1b is adhered onto each of both surfaces of the flexible printed circuit board 2a in a state where the heat-resistant film 13 faces the outside. The flexible printed circuit board 2c is obtained by laminating the flexible printed circuit board 2a and the two coverlay films 1b. The laminating method is the same as that of the above.

The flexible printed circuit board according to the present embodiment is not limited to the forms of FIGS. 4 to 6, and the number of inner layer circuit boards and the number of resin layers and the like can be appropriately determined according to required circuit designs. Furthermore, the repetition of a lamination step makes it possible to provide a multi-layered flexible printed circuit board.

Since the adhesion force of the resin film for a flexible printed circuit board of the present embodiment with the conductor layer which is an adherend is high, the resin film for a flexible printed circuit board can prevent the conductor layer from being peeled off in the manufacturing step of a printed circuit board such as a part mounting step and a soldering step. Since the flexible printed circuit board produced using the above resin film has good dielectric properties, the flexible printed circuit board can be used for electronic equipment and an antenna and the like operated at millimeter waves or terahertz waves of 30 GHz or more to be expected from now on.

Hereinabove, the preferred embodiments of the present invention were described, but these embodiments are examples used for describing the present invention, and these embodiments should not be construed as limiting the scope of the present invention. The present invention can be practiced in various modes different from the above embodiments without departing from the spirit of the present invention.

EXAMPLES

Hereinafter, the present invention will be specifically described with reference to Examples, but the present invention is not limited to these Examples.

Example 1

<Preparation of Resin Composition and Production of Resin Film>

80 g of a long-chain alkyl bismaleimide resin (long-chain alkyl bismaleimide resin having a side chain in an alkyl chain, trade name "BMI-3000", manufactured by Designer Molecules Inc.) was dissolved in toluene so that a solid content concentration was set to 60% by mass, to obtain a dissolved product, and 16 g of an aromatic bismaleimide resin (curing agent, trade name "BMI-1000", manufactured by Daiwakasei Industry Co., Ltd.) and 2 g of an aromatic diamine (curing agent, 4,4'-diaminodiphenyl ether, manufactured by Mitsui Fine Chemical Inc.) were dissolved in propylene glycol monomethyl ether (PGM) so that a solid content concentration was set to 60% by mass, to obtain a dissolved product. The two dissolved products were mixed while being stirred at room temperature, and 2 g of a peroxide (trade name "PERCUMYL D", manufactured by NOF Corporation) was further added to the mixture, to obtain a resin composition varnish.

Then, the above resin composition varnish was applied at a thickness of 85 μm on PUREX (registered trademark) A31 (trade name, polyester film, manufactured by Teijin DuPont) using an applicator, subjected to a drying treatment at 130° C. for 10 minutes using an oven, and thereafter subjected to irradiation of 100 mJ/cm$^2$ by a UV processing apparatus, to adjust resin flow, thereby producing a resin film.

<Production of Laminated Product>
(Copper Foil Laminated Product)

The resin film from which PUREX A31 was peeled off and two copper foils (trade name "F2WS-18", manufactured by Furukawa Electric Co., Ltd.) were laminated so that the roughened surface of the copper foil faced the resin film, and subjected to thermocompression bonding under conditions of 180° C., 4 MPa, and 1 hour by heat pressing, to obtain a copper foil laminated product in which the copper foil, the cured product of the resin film, and the copper foil were laminated in this order.

(LCP Laminated Product)

The resin film from which PUREX A31 was peeled off and a liquid crystal polymer film (trade name "VECSTAR CT-Z", manufactured by Kuraray Co., Ltd.) were laminated in this order on the roughened surface of the copper foil (F2WS-18), and subjected to thermocompression bonding under conditions of 180° C., 4 MPa, and 1 hour by heat pressing, to obtain an LCP laminated product in which the copper foil, the cured product of the resin film, and the liquid crystal polymer film were laminated in this order.

(Polyimide Laminated Product)

The resin film from which PUREX A31 was peeled off and a polyimide film (trade name "Kapton H200", manufactured by Toray-DuPont Co., Ltd.) were laminated in this order on the roughened surface of the copper foil (F2WS-18), subjected to thermocompression bonding under conditions of 180° C., 4 MPa, and 1 hour by heat pressing, to obtain a polyimide laminated product in which the copper foil, the cured product of the resin film, and the polyimide film were laminated in this order.

Examples 2 to 4, Comparative Example 1

Resin films were produced in the same manner as in Example 1 except that the amount of each component in Example 1 was changed to the blending amount (part by mass) of Table 1, to obtain copper foil laminated products, LCP laminated products, and polyimide laminated products.

Comparative Example 2

A copper foil laminated product, an LCP laminated product, and a polyimide laminated product were produced using a commercially available epoxy adhesion film (trade name "AS-9500", manufactured by Hitachi Chemical Co., Ltd.) in place of the resin film in Example 1.

Comparative Example 3

A copper foil laminated product, an LCP laminated product, and a polyimide laminated product were produced using a commercially available epoxy adhesion film (trade name "AS-2600", manufactured by Hitachi Chemical Co., Ltd.) in place of the resin film in Example 1.

<Measurement of Various Characteristics>

The copper foil laminated products, the LCP laminated products, and the polyimide laminated products which were obtained in Examples and Comparative Examples were evaluated in accordance with the following methods. The results are shown in Table 1.

(Dielectric Properties)

After the copper foils on both surfaces of the copper foil laminated product were removed by etching, and the laminated product was dried at 130° C. for 30 minutes, a test piece of 10 cm×5 cm was produced to measure a specific dielectric constant and a dielectric dissipation factor at 10 GHz with an SPDR dielectric resonator (manufactured by Agilent Technologies).

(Tensile Elastic Modulus)

After the copper foils on both surfaces of the copper foil laminated product were removed by etching, and the laminated product was dried at 130° C. for 30 minutes, a test piece of 20 cm×1 cm was produced to measure a tensile elastic modulus at a rate of 50 mm/min at 25° C. with a tensile tester (trade name "Autograph AGS-X", manufactured by Shimadzu Corporation).

(Copper Foil Adhesion Force)

After a copper line having a 3-mm width was formed in the copper foil on one surface of the copper foil laminated product by etching, and the copper foil laminated product was dried at 130° C. for 30 minutes, the copper line was peeled off in a direction of 90 degrees from the substrate at a rate of 50 mm/min at 25° C. with a tensile tester (Autograph AGS-X), to measure a copper foil adhesion force as the adhesion force of the cured product of the resin film with the copper foil.

(LCP Adhesion Force)

From the copper foil side of the LCP laminated product, cuts were formed in the copper foil and the cured product of the resin film by a cutter, to form lines having a 3-mm width, and the lines were peeled off in a direction of 90 degrees from the interface between the adhesion layer and LCP at a rate of 50 mm/min at 25° C. with a tensile tester (Autograph AGS-X), to measure an LCP adhesion force as the adhesion force of the cured product of the resin film with the liquid crystal polymer film.

(Polyimide Adhesion Force)

From the copper foil side of the polyimide laminated product, cuts were formed in the copper foil and the cured product of the resin film by a cutter, to form lines having a 3-mm width, and the lines were peeled off in a direction of 90 degrees from the interface between the adhesion layer and polyimide at a rate of 50 mm/min at 25° C. with a tensile tester (Autograph AGS-X), to measure a polyimide adhesion force as the adhesion force of the cured product of the resin film with the polyimide film.

(Solder Heat Resistance)

The LCP laminated product was cut to a 5-cm square, and the copper foil was removed by etching. The LCP laminated product was dried at 130° C. for 30 minutes, and then floated in a molten solder bath at 300° C. with a surface from which the copper foil had been removed by etching downward, to visually confirm the existence or non-existence of swollenness after being immersed for 30 seconds. "A" in Table represents no swollenness, and "B" represents swollenness.

TABLE 1

|  | Example 1 | Example 2 | Example 3 | Example 4 | Comparative Example 1 | Comparative Example 2 | Comparative Example 3 |
|---|---|---|---|---|---|---|---|
| Long-chain alkyl bismaleimide resin | 80 | 50 | 96 | 45 | 0 | — | — |
| Aromatic bismaleimide resin | 16 | 46 | 0 | 51 | 96 | — | — |
| Aromatic diamine | 2 | 2 | 2 | 2 | 2 | — | — |
| Peroxide | 2 | 2 | 2 | 2 | 2 | — | — |
| Specific dielectric constant | 2.6 | 2.6 | 2.6 | 2.9 | 2.9 | 3.2 | 3.0 |
| Dielectric dissipation factor | 0.0025 | 0.0027 | 0.0025 | 0.0041 | 0.0048 | 0.0230 | 0.0260 |
| Elastic modulus (MPa) | 120 | 200 | 80 | 200 | 1500 | 750 | 650 |
| Copper foil adhesion force (kN/m) | 1.0 | 1.0 | 1.4 | 1.0 | 0.8 | 1.5 | 1.2 |
| LCP adhesion force (kN/m) | 0.5 | 0.4 | 0.7 | 0.2 | 0.1 | 0.8 | 0.9 |

TABLE 1-continued

| | Example 1 | Example 2 | Example 3 | Example 4 | Comparative Example 1 | Comparative Example 2 | Comparative Example 3 |
|---|---|---|---|---|---|---|---|
| Polyimide adhesion force (kN/m) | 1.0 | 1.0 | 1.1 | 0.9 | 0.9 | 1.2 | 1.1 |
| Solder heat resistance | A | A | A | A | B | — | — |

Examples 1 to 4 had more excellent dielectric properties and adhesion force than those of Comparative Example 1 which did not use the long-chain alkyl bismaleimide resin, and particularly more excellent dielectric properties than those of Comparative Examples 2 and 3 using the commercially available resin film.

INDUSTRIAL APPLICABILITY

The present invention can provide a resin film for a flexible printed circuit board, a metal foil provided with a resin, a coverlay film, a bonding sheet, and a flexible printed circuit board which achieve both low dielectric properties and adhesiveness to an adherend during thermal curing.

REFERENCE SIGNS LIST

1a: metal foil provided with resin, 1b: coverlay film, 1d: bonding sheet, 2a, 2b, 2c: flexible printed circuit board, 11: resin film, 12: metal foil, 13: heat-resistant film, 14: insulating substrate, 15: conductive pattern, 16: flexible double-sided printed circuit board

The invention claimed is:

1. A resin film for a flexible printed circuit board including a resin composition comprising:
   a long-chain alkyl bismaleimide resin having a main chain containing an alkylene chain having 10 or more carbon atoms and a side chain containing an alkyl group bonded to the alkylene chain; and
   a curing agent having two or more functional groups reacting with the long-chain alkyl bismaleimide resin, the curing agent including any one or more selected from an unsaturated hydrocarbon, an aromatic amine, an aliphatic amine, and an alicyclic amine.

2. The resin film for a flexible printed circuit board according to claim 1, wherein the resin composition further comprises a reaction initiator.

3. The resin film for a flexible printed circuit board according to claim 1, wherein the long-chain alkyl bismaleimide resin contains a compound having a maleimide group, a divalent group having at least two imide bonds, and a saturated or unsaturated divalent hydrocarbon group.

4. A metal foil provided with a resin comprising:
   the resin film for a flexible printed circuit board according to claim 1; and a metal foil.

5. A coverlay film comprising:
   the resin film for a flexible printed circuit board according to claim 1; and a heat-resistant film.

6. A bonding sheet comprising the resin film for a flexible printed circuit board according to claim 1.

7. A flexible printed circuit board comprising:
   an insulating substrate having a conductive pattern; and
   a resin layer provided on at least one surface of the insulating substrate,
   wherein the resin layer contains a cured product of a resin composition comprising: a long-chain alkyl bismaleimide resin having a main chain containing an alkylene chain having 10 or more carbon atoms and a side chain containing an alkyl group bonded to the alkylene chain; and a curing agent having two or more functional groups reacting with the long-chain alkyl bismaleimide resin, the curing agent including any one or more selected from an unsaturated hydrocarbon, an aromatic amine, an aliphatic amine, and an alicyclic amine.

8. The flexible printed circuit board according to claim 7, wherein the resin composition further comprises a reaction initiator.

9. The flexible printed circuit board according to claim 7, wherein the long-chain alkyl bismaleimide resin contains a compound having a maleimide group, a divalent group having at least two imide bonds, and a saturated or unsaturated divalent hydrocarbon group.

10. The flexible printed circuit board according to claim 8, wherein the long-chain alkyl bismaleimide resin contains a compound having a maleimide group, a divalent group having at least two imide bonds, and a saturated or unsaturated divalent hydrocarbon group.

11. The resin film for a flexible printed circuit board according to claim 2, wherein the long-chain alkyl bismaleimide resin contains a compound having a maleimide group, a divalent group having at least two imide bonds, and a saturated or unsaturated divalent hydrocarbon group.

12. The resin film for a flexible printed circuit board according to claim 1, wherein the curing agent further includes any one or more selected from an alicyclic maleimide and an aromatic maleimide.

13. The flexible printed circuit board according to claim 7, wherein the curing agent further includes any one or more selected from an alicyclic maleimide and an aromatic maleimide.

14. The resin film for a flexible printed circuit board according to claim 1, wherein the curing agent further includes an aromatic maleimide.

15. The flexible printed circuit board according to claim 7, wherein the curing agent further includes an aromatic maleimide.

16. The resin film for a flexible printed circuit board according to claim 1, wherein the curing agent includes the aromatic amine and further includes an aromatic maleimide.

17. The flexible printed circuit board according to claim 7, wherein the curing agent includes the aromatic amine and further includes an aromatic maleimide.

* * * * *